(12) United States Patent
Chu Chen

(10) Patent No.: US 7,783,926 B2
(45) Date of Patent: Aug. 24, 2010

(54) METHOD FOR MEMORY TESTING

(75) Inventor: Chi-Yuan Chu Chen, Taipei (TW)

(73) Assignee: Inventec Corporation, Taipei (TW)

( * ) Notice: Subject to any disclaimer, the term of this patent is extended or adjusted under 35 U.S.C. 154(b) by 387 days.

(21) Appl. No.: 12/007,115

(22) Filed: Jan. 7, 2008

(65) Prior Publication Data

US 2009/0177925 A1    Jul. 9, 2009

(51) Int. Cl.
*G06F 11/00* (2006.01)
(52) U.S. Cl. .............................. 714/36; 714/718; 713/2
(58) Field of Classification Search .................. 714/36, 714/42, 718; 713/2
See application file for complete search history.

(56) References Cited

U.S. PATENT DOCUMENTS

| | | | | |
|---|---|---|---|---|
| 5,463,766 A | * | 10/1995 | Schieve et al. .................. | 713/2 |
| 5,884,073 A | * | 3/1999 | Dent .............................. | 713/2 |
| 5,987,625 A | * | 11/1999 | Wolff ........................... | 714/36 |
| 7,162,625 B2 | * | 1/2007 | Stern et al. ..................... | 713/2 |
| 7,188,278 B1 | * | 3/2007 | Diaz et al. ..................... | 714/36 |
| 7,325,176 B2 | * | 1/2008 | Larson et al. ................ | 714/718 |
| 7,376,944 B2 | * | 5/2008 | Crisan et al. ................. | 717/171 |
| 7,664,988 B2 | * | 2/2010 | Haishima ...................... | 714/36 |
| 2002/0147941 A1 | * | 10/2002 | Gentile ......................... | 714/36 |
| 2004/0078679 A1 | * | 4/2004 | Cagle et al. ................... | 714/36 |
| 2004/0153846 A1 | * | 8/2004 | Lee .............................. | 714/42 |
| 2004/0181656 A1 | * | 9/2004 | Stern et al. ..................... | 713/1 |
| 2004/0255197 A1 | * | 12/2004 | Schelling ...................... | 714/36 |
| 2005/0005197 A1 | * | 1/2005 | Chong et al. .................. | 714/36 |

\* cited by examiner

*Primary Examiner*—Marc Duncan
(74) *Attorney, Agent, or Firm*—CKC & Partners Co., Ltd.

(57) ABSTRACT

A method for memory testing implemented on an embedded system, the method comprising steps of loading a booting program when the embedded system is booted; activating a RAM of the embedded system by the booting program; duplicating the booting program itself and writing the duplicated booting program into a first section of the RAM by the booting program; downloading a testing program from an on-line source and writing the downloaded testing program into a second section of the RAM by the duplicated booting program; and enabling the downloaded testing program to check a third section the rest part of the RAM excepting the first and second sections, after the downloaded testing program is executed by the duplicated booting program.

3 Claims, 3 Drawing Sheets

METHOD FOR MEMORY TESTING

BACKGROUND

1. Field of Invention

This invention is related to a method of memory testing, and more particularly to a method for testing a random access memory (RAM) of an embedded system.

2. Description of Related Art

In view of the size of semiconductor manufacturing process evolves small and the level of the IC design industry advances, the IC product undoubtedly becomes complicated and delicate accordingly. Consequently, the IC product with higher reliability, better quality, lower cost and faster product launching is expected urgently by the buyer markets.

Due to the small size of semiconductor manufacturing process, the potential defects on the embedded memory are getting obvious frequently and these defects are especially easy to affect the effectiveness of the embedded memory. On the other hand, due to the advanced level of the IC design industry, Read-Only Memory (ROM), Random Access Memory (RAM) and Electrically Erasable Programmable Read-Only memory (EEPROM) are expected to frequently implement in the related industry.

For venders, the prior memory testing method mostly is RAM Stress Test (RST) method, in which the RST method tests endurance of the RAM by looping the program therein, whether a chipset is in malfunction or not.

However, the RST method merely provides tests of address lines and jumps of the RAM, hence the RST method fails to test the RAM completely and effectively and thus wastes much time in the duration of testing. Therefore, it is crucial for the entire industry to develop a new method for memory testing to improve the drawbacks discussed above and cut down the time for doing so.

SUMMARY

It is therefore an objective of the present invention to present a method for memory testing to accelerate a process of the RAM testing and to save manpower in operation.

To achieve the foregoing objectives, the present invention provides a method for memory testing which implements on an embedded system, the method comprises steps of loading a booting program from a ROM of the embedded system when the embedded system is booted; activating a RAM of the embedded system by the booting program; duplicating the booting program itself and writing the duplicated booting program into a first section of the RAM by the booting program; downloading a testing program from an on-line source and writing the downloaded testing program into a second section of the RAM by the duplicated booting program; and the embedded system enabling the downloaded testing program to circularly check a third section which is the rest part of the RAM excepting the first and second sections after the downloaded testing program is executed by the duplicated booting program, terminating to check the third section until an error has been found by the downloaded testing program.

According to an embodiment of the present invention, the downloaded testing program proceeds with testing processes of a data line testing, an address line testing, an increment/decrement testing, a delay testing, a burst testing and a random testing to the third section of the RAM. The downloaded testing program will circulate the above tests when the RAM is tested with no error, otherwise, the testing program will terminate the testing processes when an error is tested on the RAM within one of the testing processes.

BRIEF DESCRIPTION OF THE DRAWINGS

The structure and the technical means adopted by the present invention to achieve the above and other objects can be best understood by referring to the following detailed description of the preferred embodiments and the accompanying drawings, where.

DESCRIPTION OF THE PREFERRED EMBODIMENTS

Figure 1:
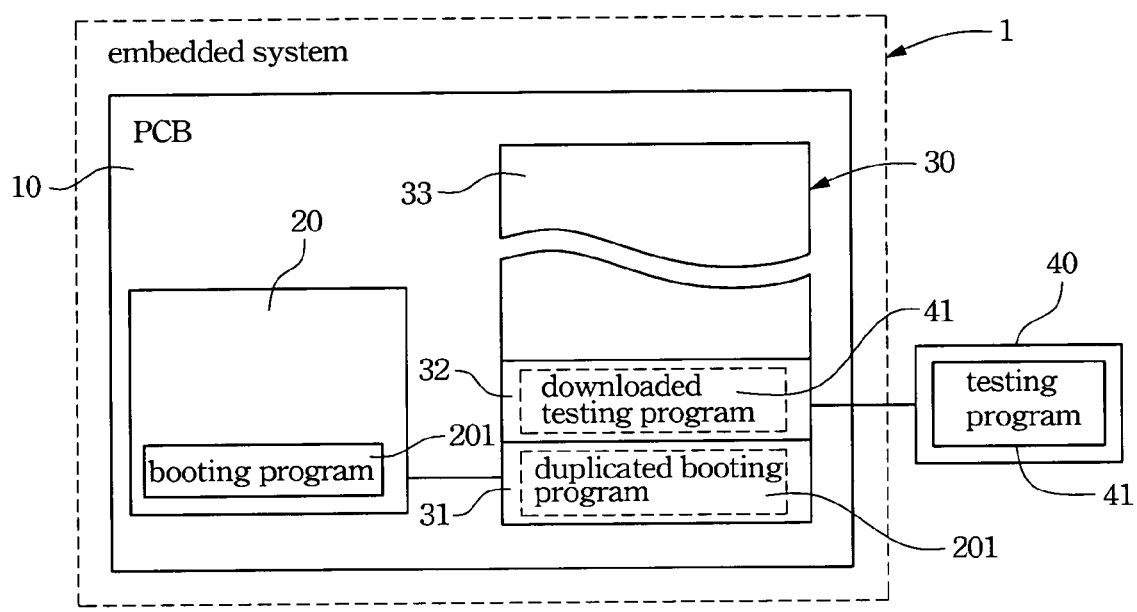
FIG. 1 is an electronic block diagram of the embedded system of the present invention.

Please refer to FIG. 1, an electronic block diagram of the embedded system of the present invention. A method for memory testing disclosed in an embodiment can be implemented on an embedded system 1 (e.g. mobile phone or MP3 player). A read only memory 20 (ROM) including Programmable Read-Only Memory (PROM), Erasable Programmable Read-Only Memory (EPROM), Electrically Erasable Programmable Read-Only Memory (EEPROM) and Flash, and a random access memory 30 (RAM) including Dynamic Random Access Memory (DRAM) and Static Random Access Memory (SRAM), are both deposited on a PCB 10 of the embedded system 1.

The RAM 30, a memory for reading data therein and writing data into thereof, is a main storage area for the embedded system 1 to temporarily store commands and data. It is crucial for the RAM 30 in the effectiveness and speed of the embedded system 1 according to the RAM 30's capacity and stability. The ROM 20, a semiconductor memory for not losing data therein while the supporting power is shut down, is resided at a booting program 201 (e.g. boot-loader or U-boot) therein. When the embedded system 1 is powered up, the booting program 201 is instantly activated, and then the booting program 201 activates the RAM 30 and other elements such as graphic card on the PCB 10 to stand by for working.

Figure 2:
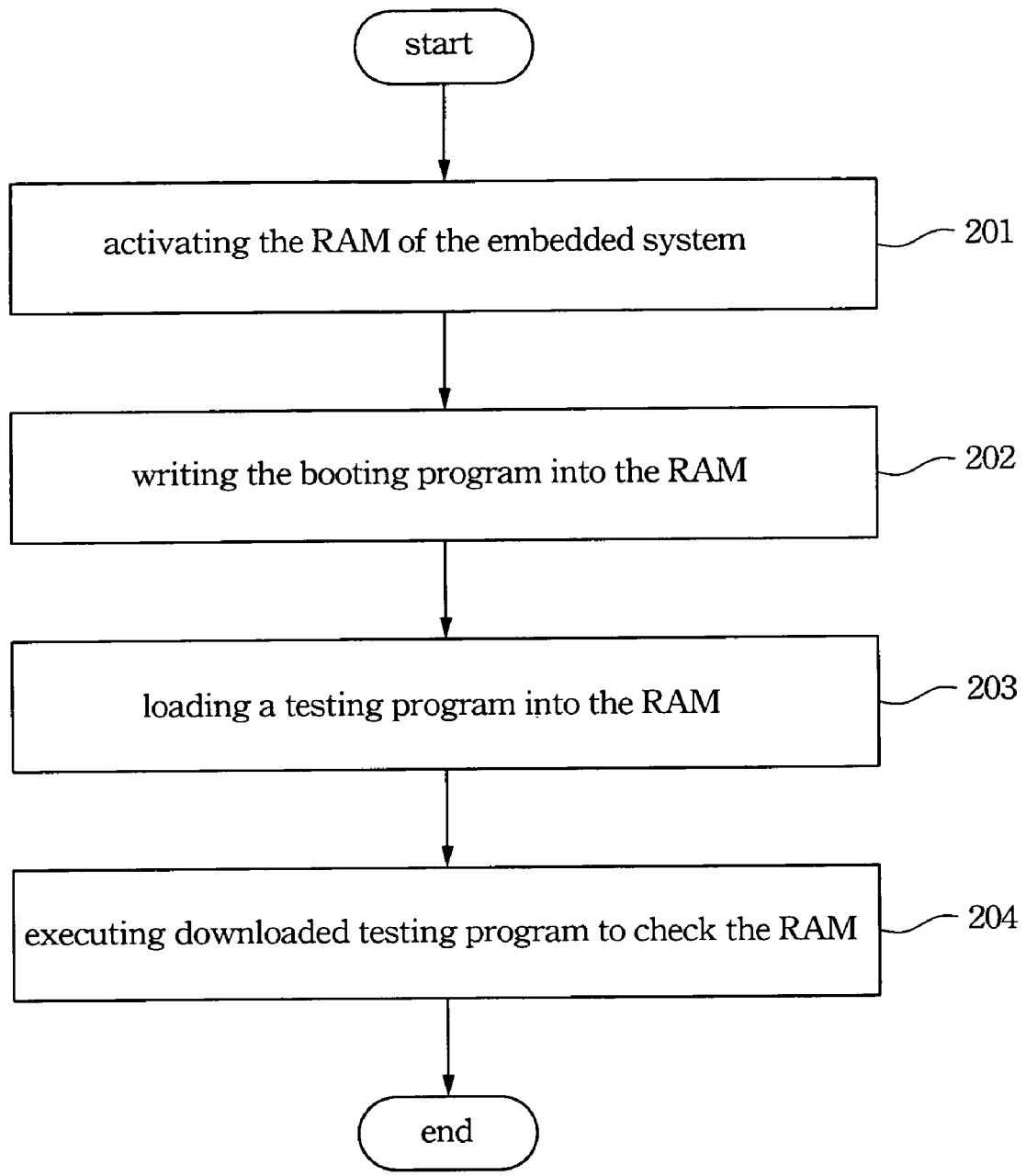
FIG. 2 is a flow chart according to a method of the present invention.

Please refer to FIG. 2, FIG. 2 shows a flow chart according to the method of the present invention. After the embedded system 1 is powered up and the booting program 201 is instantly activated, the embedded system 1 processes the steps as follows to test the RAM 30 by the booting program:

Step (201) activating the RAM 30 of the embedded system 1:

In this step, the booting program 201 must activate some of elements on the PCB 10 including the RAM 30, thus the RAM 30 provides the embedded system 1 to rapidly store and read temporary data and commands in processing operations. The embedded system 1 then moves to step (201).

Step (202) writing the booting program 201 itself into the RAM 30 by the booting program 201:

In order to speed the processing operation of the booting program 201 in the embedded system 1, the booting program 201 duplicates itself and writes the duplicated booting program 201 into a first section 31 of the RAM 30 by the booting program 201. The first section 31 is defined for placing the duplicated booting program 201 only and implied that the duplicated booting program 201 in it will not be tested in the future.

Step (203) loading a testing program 41 into the RAM 30:

Before the embedded system 1 of this embodiment proceeds to test the RAM 30, the embedded system 1 must electrically connect to a server 40 which obeys Trivial File Transfer Protocol (TFTP) on an on-line source in which the protocol "TFTP" is a transferring protocol in one group of TCP/IP for proceeding in trivial file transformation among some client terminals and a server terminal, which purposes to provide a simple, predetermined content and small capacity of file transferring service, and the server 40 is able to store different testing programs 41. Since TFTP only provides file transfer services and guarantees the complete file transformation but accessing authority and identification mechanism, it is common to be implemented in a secured local area network.

In this step a testing program 41 stored in the server 40 for testing the RAM 30 must be downloaded from the server 40 and be written into a second section 32 of the RAM 30 by the duplicated booting program 201. The second section 32 only is defined for placing the downloaded testing program 41 and implied that the downloaded testing program 41 in it will not be tested in the future. The downloaded testing program 41 is provided to check a third section 33 of the RAM 30 which is the rest part of the RAM 30 excepting the first and second sections 31, 32.

Step (204) executing downloaded testing program 41 to check the RAM 30:

When the downloaded testing program 41 is executed by the duplicated booting program 201, the embedded system 1 enables the downloaded testing program 41 to circularly check the third section 33 but the first, second section 31, 32 thereof.

Figure 3:
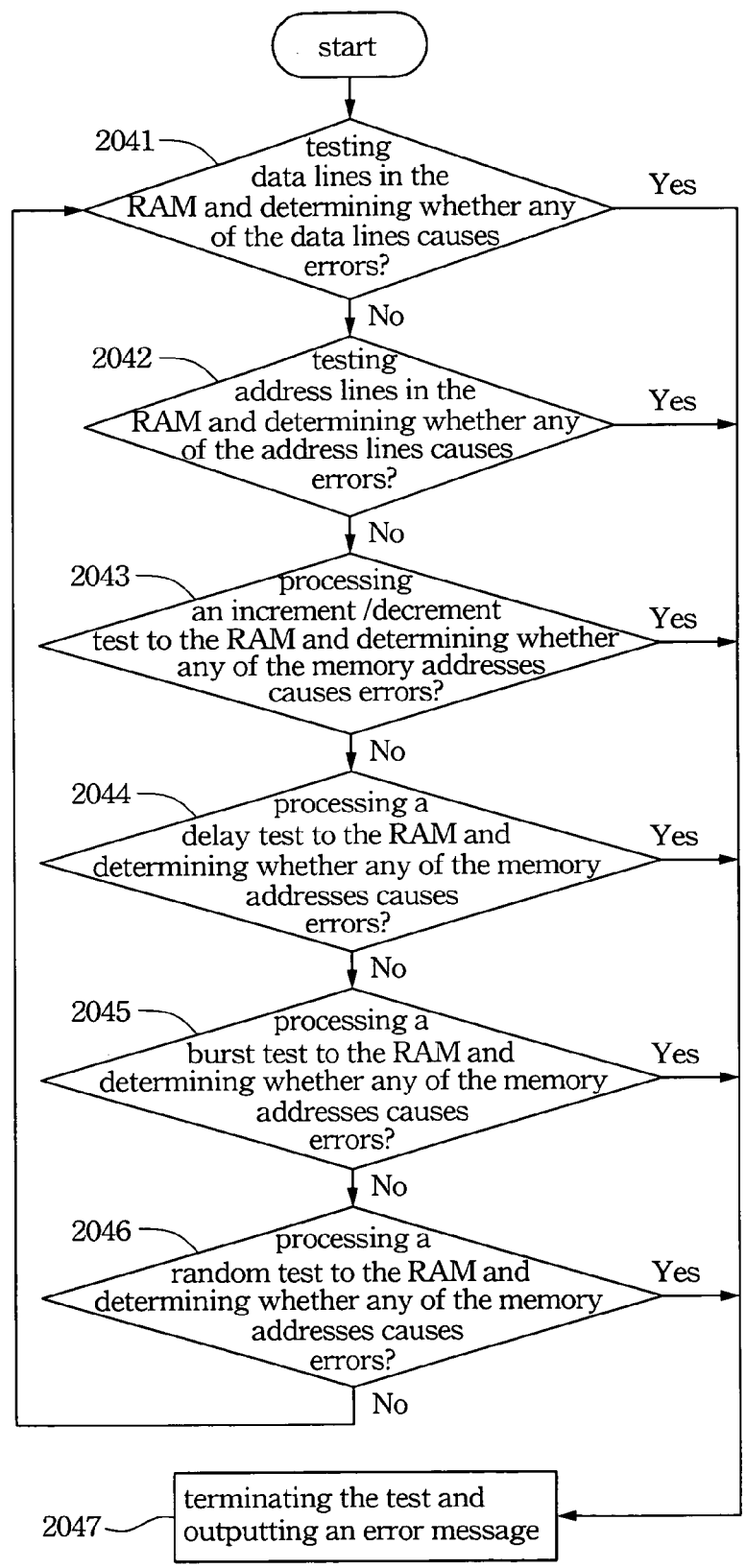
FIG. 3 is a flow chart according to a detailed content of the method of the present invention.

According to FIG. 3, shows a flow chart according to a detailed testing content of the method of the present invention, the downloaded testing program 41 processes each step or all steps as follows:

Step (2041) respectively testing a plurality of data lines of the third section 33 in the RAM 30 and determining whether any of the data lines thereof causes errors:

The downloaded testing program 41 respectively proceeds with a data accessing testing to the data lines of the third section 33 in the RAM 30 and processes step (2047) when the downloaded testing program 41 determines that one of the data lines thereof causes errors, otherwise, the downloaded testing program 41 processes step (2042) when the downloaded testing program 41 determines that none of data lines thereof causes errors.

Step (2042) respectively testing a plurality of address lines of the third section 33 in the RAM 30 and determining whether any of the address lines thereof causes errors:

The downloaded testing program 41 respectively proceeds with a data accessing testing to the address lines of the third section 33 in the RAM 30 and processes step (2047) when the downloaded testing program 41 determines that one of the address lines thereof causes errors, otherwise, the downloaded testing program 41 processes step (2043) when the downloaded testing program 41 determines that none of the address lines thereof causes errors.

Step (2043) respectively processing an increment/decrement test to a plurality of memory addresses of the third section 33 in the RAM 30 and determining respectively whether any of the memory addresses thereof causes errors:

The downloaded testing program 41 respectively proceeds with the increment/decrement test that interchangedly writes and loads data to the memory addresses of the third section 33 in the RAM 30, and process step (2047) when the downloaded testing program 41 determines that one of memory addresses thereof causes errors to fail the testing, otherwise, the downloaded testing program 41 will process step (2044).

Step (2044) respectively processing a delay test to a plurality of memory addresses of the third section 33 in the RAM 30 and determining respectively whether any of the memory addresses thereof causes errors:

The downloaded testing program 41 respectively proceeds with the delay test which is to write data into the memory addresses of the third section 33 in the RAM 30, and to respectively load the data out that is used to be written, from the memory addresses thereof after a period of time. Then, the downloaded testing program 41 processes step (2047) when the downloaded testing program 41 determines that once data loaded out from the memory addresses is not the same as the one used to be written, otherwise, the downloaded testing program 41 processes step (2045) when the downloaded testing program 41 determines that the data loaded out from the memory addresses is the same as the one used to be written.

Step (2045) respectively processing a burst test to a plurality of memory addresses of the third section 33 in the RAM 30 and determining respectively whether any of the memory addresses thereof causes errors:

The downloaded testing program 41 proceeds with the burst test which is to respectively write a large volume of data into the memory addresses of the third section 33 in the RAM 30. Then, the downloaded testing program 41 processes step (2047) when the downloaded testing program 41 determines that one of the memory addresses is unable to accept the large volume of data, otherwise, the downloaded testing program 41 process step (2046) when the downloaded testing program 41 determines that none of the memory addresses is unable to accept the large volume of data.

Step (2046) respectively processing a random test to a plurality of memory addresses of the third section 33 in the RAM 30 and determining respectively whether any of the memory addresses thereof causes errors:

The downloaded testing program 41 proceeds with the random test to respectively process a data accessing testing to one of memory addresses thereof randomly. Then, the downloaded testing program 41 processes step (2047) when the downloaded testing program 41 determines that the tested memory address fails to process data accessing testing, otherwise, the downloaded testing program 41 will process step (2041) again, when the downloaded testing program 41 determines that the tested memory address succeeds to process data accessing testing.

Step (2047) terminating the test and outputting an error message while any of the memory addresses thereof causes errors:

The downloaded testing program 41 will terminate processing any or all steps (2041) to (2046) and output an error message to the embedded system 1, while it determines that one of the memory addresses thereof cause errors within any steps (2041)-(2046).

To be noticed that steps (2041) to (2046) are not necessarily to be processed by following the order mentioned above, and are able to be independently processed to represent step (204) to achieve a goal of testing RAM 30.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for memory testing, which is implemented on an embedded system, the method comprising:

loading a booting program when the embedded system is booted;

activating a RAM of the embedded system by the booting program;

duplicating the booting program itself and writing the duplicated booting program into a first section of the RAM by the booting program;

downloading a testing program from an on-line source and writing the downloaded testing program into a second section of the RAM by the duplicated booting program; and after the downloaded testing program is executed by the duplicated booting program, the downloaded testing program is enabled to circularly check a third section which is the rest part of the RAM excepting the first and second sections, by steps comprising:

respectively testing a plurality of data lines of the third section in the RAM and determining whether any of the data lines thereof causes errors, and terminating the test and outputting an error message while any of the data lines thereof causes errors;

respectively testing a plurality of address lines of the third section in the RAM and determining whether any of the address lines thereof causes errors, and terminating the test and outputting an error message while any of the address lines thereof causes errors;

respectively processing an increment/decrement test to a plurality of memory addresses of the third section in the RAM and determining respectively whether any of the memory addresses thereof causes errors, and terminating the increment/decrement test and outputting an error message while any of the memory addresses thereof causes errors;

respectively processing a delay test to a plurality of memory addresses of the third section in the RAM and determining respectively whether any of the memory addresses thereof causes errors, and terminating the delay test and outputting an error message while any of the memory addresses thereof causes errors;

respectively processing a burst test to a plurality of memory addresses of the third section in the RAM and determining respectively whether any of the memory addresses thereof causes errors, and terminating the burst test and outputting an error message while any of the memory addresses thereof causes errors; and respectively processing a random test to a plurality of memory addresses of the third section in the RAM and determining respectively whether any of the memory addresses thereof causes errors, and terminating the random test and outputting an error message while any of the memory addresses thereof causes errors.

2. The method as claimed in claim 1, wherein the on-line source in the downloading step is a server that obeys Trivial File Transfer Protocol (TFTP).

3. The method as claimed in claim 2, wherein the testing program provided for testing the RAM resides in the server.

* * * * *